United States Patent
Lee et al.

[11] Patent Number: 5,926,308
[45] Date of Patent: Jul. 20, 1999

[54] HIGH-SPEED OPTICAL MODULATOR MODULE

[75] Inventors: Hae-Young Lee, Seoul; Sang-Bae Kim, Suwon; Soung-Il Kim, Seoul; Ki-Soo Park, Suwon, all of Rep. of Korea

[73] Assignee: Samsung Electronics Co., Ltd., Kyungki-do, Rep. of Korea

[21] Appl. No.: 08/927,753

[22] Filed: Sep. 11, 1997

[30] Foreign Application Priority Data

Sep. 14, 1996 [KR] Rep. of Korea ............... 96-39990

[51] Int. Cl.[6] ............... G02B 26/00; H01S 3/10
[52] U.S. Cl. ............... 359/237; 372/26
[58] Field of Search ............... 359/237; 372/33, 372/26, 31, 38; 332/107, 116

[56] References Cited

U.S. PATENT DOCUMENTS 5,623,514  4/1997  Arai ............... 375/222

Primary Examiner—Georgia Epps
Assistant Examiner—John Woolner
Attorney, Agent, or Firm—Dilworth & Barrese

[57] ABSTRACT

A high-speed optical modulator module which includes: a lead frame having an outer lead frame and an inner lead frame, the outer lead frame for receiving a high-speed signal; a substrate, in which a metal base having a matching impedance device, and a submount having a laser diode thereon, are formed; a first multi-bonding wire for electrically connecting the inner lead frame of the lead frame to one end of the matching impedance device; a second multi-bonding wire for electrically connecting the other end of the matching impedance device to one end of the metal base; and a dual-bonding wire for electrically connecting the other end of the metal base to the laser diode. The matching impedance device includes a matching resistor and a compensation capacitor connected in parallel. The module is formed by packaging and sealing the components other than the outer lead frame.

20 Claims, 2 Drawing Sheets

HIGH-SPEED OPTICAL MODULATOR MODULE

BACKGROUND OF THE INVENTION

1. Field of the Invention

The present invention relates to an optical modulator module for communication systems and, more particularly, to a high-speed optical modulator module having an improved matching impedance.

2. Description of the Related Art

For a general 2.5 Gbps optical modulator module, a driving circuit and a transmission line having an internal impedance of 50Ω are typically used. A module of 25Ω characteristic impedance is sometimes used.

It is favorable in terms of production cost that the matching impedance be reduced to 25Ω, but without changing the configuration of the 50Ω optical modulator module. However, if the matching impedance decreases, the inductive parasitic impedance of the lead frame and the bonding wire may cause the modulation characteristics of the optical modulator module used in the 2.5 Gbps system to deteriorate, thus resulting in a high transmission error rate. Referring to FIGS. 1 and 2, the above example is explained below.

FIG. 1 shows the planar structure of a conventional optical modulator module having an internal impedance of 50Ω. As shown in the drawing, the optical modulator module is packaged in such a manner that lead frame 10 and pad 20 are sealed with ceramic. Lead frame 10 includes an outer lead frame 12 exposed externally from the ceramic package, and an inner lead frame 14 sealed by the ceramic package. Onto pad 20 a substrate is attached, in which two chip resistors 22 and 24, DC biasing conductive plate 26, and a laser diode 28, are formed. Laser diode 28 is supported by submount 27. A high-speed signal is supplied to pin #12 of outer lead frame 12 via a coaxial cable. Inner lead frame 14 has the construction of a coplanar waveguide (CPW) comprised of signal lead S and peripheral ground leads G. Since the CPW is tens of times shorter than the wavelength at 2.5 GHz, the characteristic impedance is not sufficiently different from the coaxial cable's impedance; thus there is little variation in the modulation efficiency of the reflected wave. The two ground leads G of the CPW are in direct contact with the inner wall of the package, thereby reducing the common ground inductance.

One end of both chip resistors 22 and 24 are connected to signal lead S with multi-wire bonding; the other ends are connected to DC biasing conductive plate 26 with multi-wire bonding. The two chip resistors are configured in parallel; thus if the resistance of each chip resistor is 100Ω, the parallel resistance is 50Ω. The multi-wire bonding reduces the parasitic inductance inherent in single wire bonding. The other end of DC biasing conductive plate 26 is connected to laser diode 28 with dual-wire bonding.

In these types of optical modulator modules, the inductance of the bonding wires, the matching impedance, and the frequency characteristic of the laser diode, are important factors pertaining to high-frequency modulation characteristics. In particular, the series inductance of the bonding wires considerably limits the maximum bandwidth by impeding current flow at high frequencies.

FIG. 2 is a graph illustrating the frequency characteristics curve of the conventional optical modulator module of FIG. 1, specifically depicting how the frequency characteristics of the module are affected by the modules matching impedance. Referring to FIG. 2, specifically the frequency characteristics of the intrinsic semiconductor laser diode, the limit frequency at which the normalized response gain is −3 dB is over 10 GHz. However, if a matching impedance of 50Ω is coupled, the limit frequency at which the normalized response gain is −3 dB is at 10 GHz, thus resulting in a reduced bandwidth. Furthermore, if a matching impedance of 25Ω is coupled, the limit frequency becomes 3 GHz, which drastically reduces the bandwidth. For this reason, when the resistance of the matching impedance is simply reduced from 50Ω to 25Ω, it is difficult to expect reliable operation at 2.5 GHz due to the reduction of the external bandwidth and gain, and the effect of noise.

SUMMARY OF THE INVENTION

Therefore, it is an object of the present invention to provide a high-speed optical modulator module having an improved matching impedance which ensures transmission reliability at high speed, e.g., at around 2.5 GHz.

To accomplish the object of the present invention, a high-speed optical modulator module is provided, which includes: a lead frame having an outer lead frame and an inner lead frame, the outer lead frame for receiving a high-speed signal; a substrate, in which a metal base having a matching impedance device, and a submount having a laser diode thereon, are formed; a first multi-bonding wire for electrically connecting the inner lead frame of the lead frame to one end of the matching impedance device; a second multi-bonding wire for electrically connecting the other end of the matching impedance device to one end of the metal base; and a dual-bonding wire for electrically connecting the other end of the metal base to the laser diode. The matching impedance device includes a matching resistor and a compensation capacitor connected in parallel.

DETAILED DESCRIPTION OF PREFERRED EMBODIMENTS

Hereinafter, a preferred embodiment of the present invention will be described with reference to the attached drawings.

Figure 1:
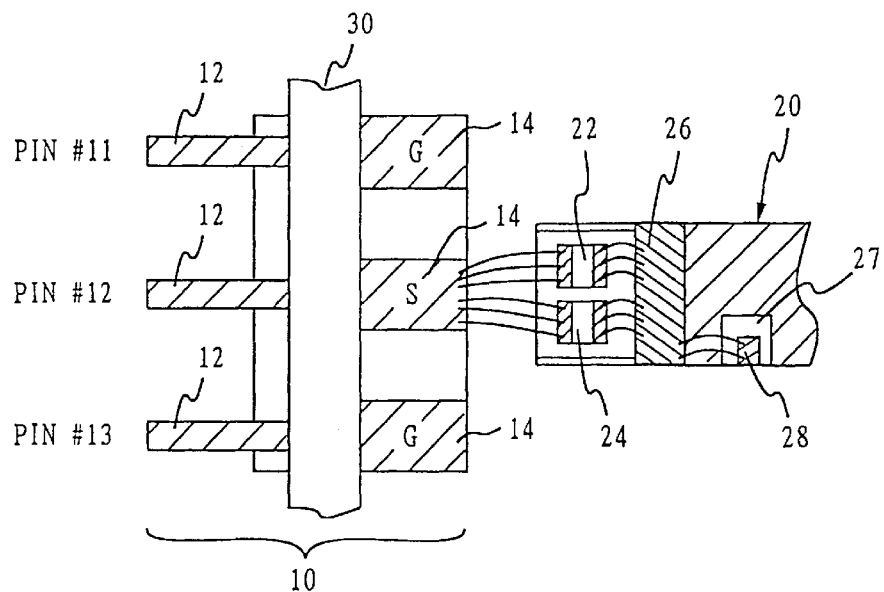
FIG. 1 is a diagram illustrating the planar structure of a conventional optical modulator module having an internal impedance of 50Ω.
Figure 2:
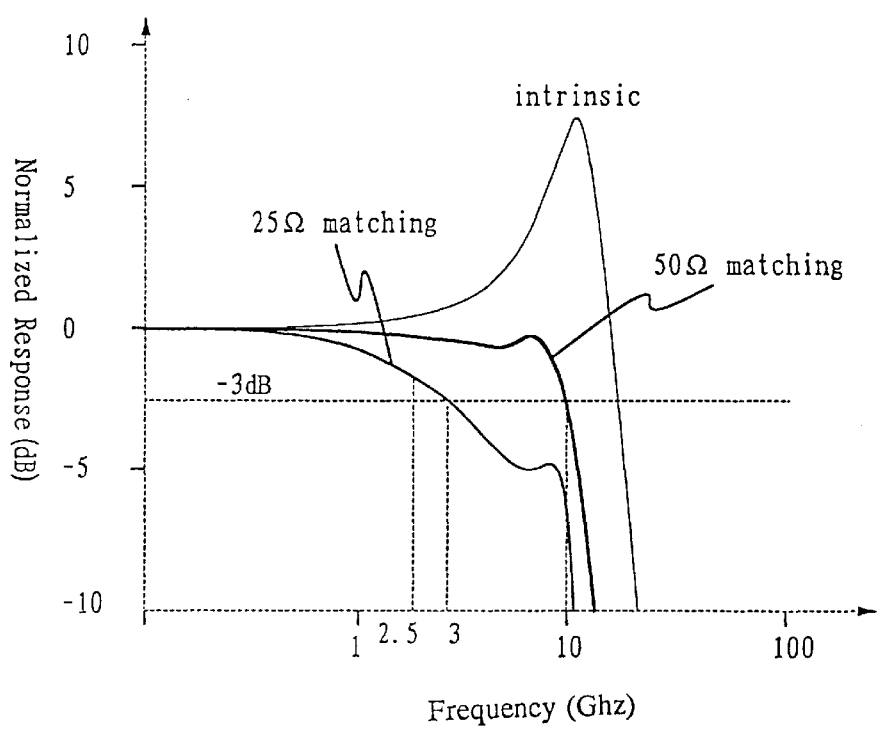
FIG. 2 is a graph illustrating the frequency characteristics of the conventional optical modulator module of FIG. 1 with respect to matching impedance.
Figure 3:
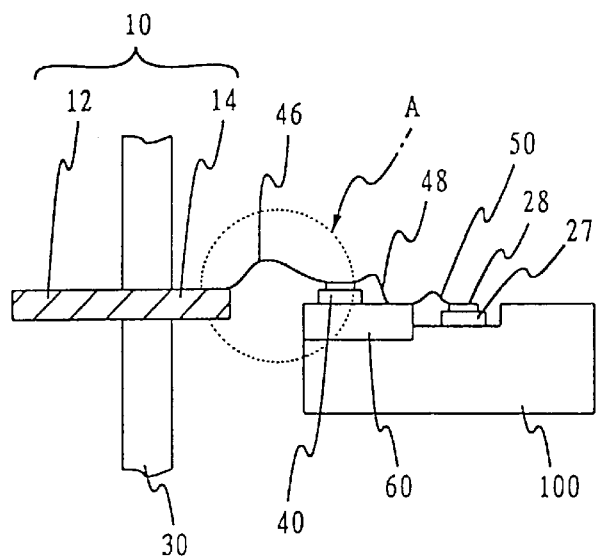
FIG. 3 is a diagram illustrating the lateral structure of one embodiment of the high-speed optical modulator module of the present invention.
Figure 4:
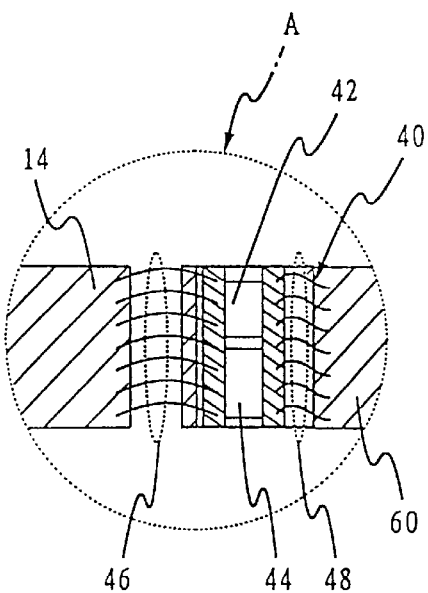
FIG. 4 is an enlarged diagram of a planar structure of portion A of FIG. 3.

Referring to FIGS. 3 and 4, one embodiment of the high-speed optical modulation module of the present invention comprises a lead frame 10 having an outer lead frame 12 and inner lead frame 14, the outer lead frame 12 for receiving a high-speed signal. Additionally, there is a substrate 100, in which a metal base 60 having a matching impedance device 40, and a submount 27 having a laser diode 28 thereon, are formed. The matching impedance device 40 includes a matching resistor 42 and compensation capacitor 44 connected in parallel.

The matching resistor 42 and compensation capacitor 44 are preferably of the chip resistor and chip capacitor type. Preferably, matching resistor 42 has a resistance of 25Ω, around 560 μm×560 μm in dimension. Also, compensation capacitor 44 preferably has a capacitance of 2.5 pF and is the same in area as matching resistor 42. As compared with the conventional optical modulator module having an impedance of 50Ω in which two chip resistors of 100Ω are connected in parallel, this embodiment reduces the required area by ¼, thereby decreasing the physical size of the module and the production cost. Metal base 60 is preferably gold-plated, having a size of around 3,000 μm×2,000 μm.

The optical modulator module further comprises a first multi-bonding wire 46 of around 1.2 mm for electrically connecting inner lead frame 14 of lead frame 10 to one end of matching impedance device 40, a second multi-bonding wire 48 of around 0.5 mm for electrically connecting the other end of matching impedance device 40 to one end of metal base 60, and a dual-bonding wire 50 of around 1 mm for electrically connecting the other end of metal base 60 to laser diode 28. The optical modulator module is formed by packaging and sealing the components, other than outer lead frame 12, in ceramic.

Operation of an illustrative embodiment according to the present invention will be described below.

Figure 5:
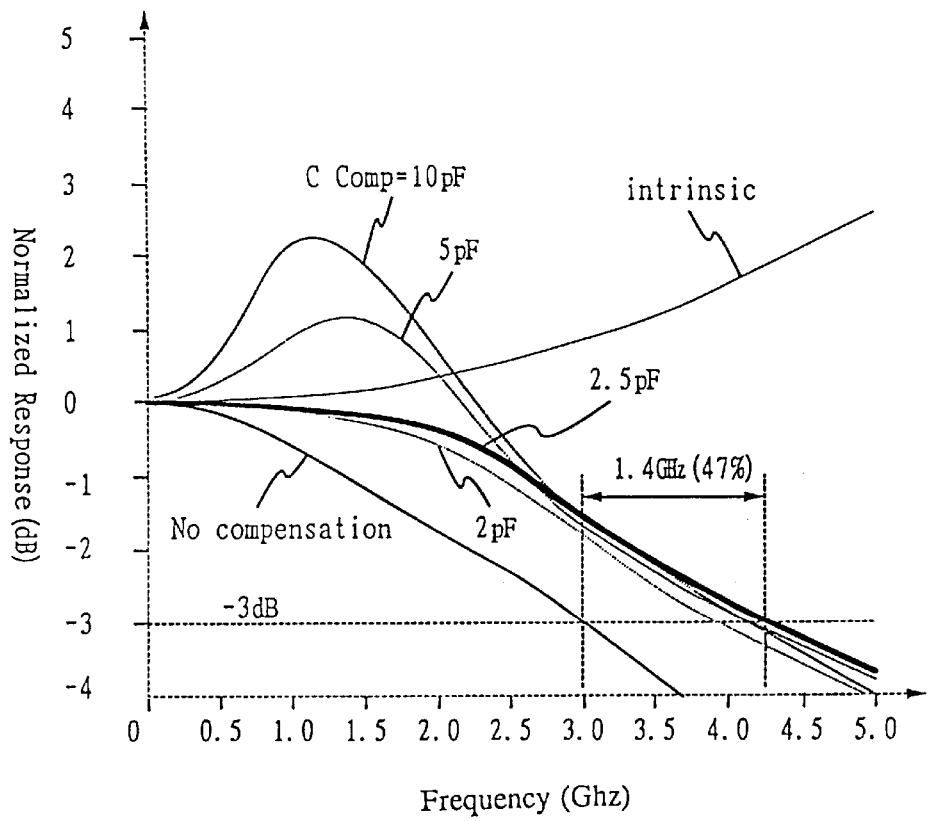
FIG. 5 is a graph illustrating the frequency characteristics of the high-speed optical modulator module of the present invention with respect to matching impedance.

FIG. 5 is a graph illustrating the frequency characteristics curve of the high-speed optical modulator module of the present invention, specifically depicting how the frequency characteristics of the module are affected by the compensation capacitor of the matching impedance device.

Referring to FIG. 5, as the capacitance of the compensation capacitor increases from 2 pF to 10 pF, the resonant frequency of the module gradually moves to a lower frequency, thereby increasing the response magnitude.

In the case of no compensation capacitor, the limit frequency at which the normalized response gain is −3 dB is around 2.9 GHz. When a compensation capacitor of 2.5 pF is utilized, the limit frequency at which the normalized response gain is −3 dB increases to around 4.3 GHz, thereby resulting in a bandwidth expansion of 1.4 GHz (47%). It is noted that the capacitance where the bandwidth is the largest and the response magnitude is uniform is 2.5 pF.

As described above, the technique employed to the illustrative embodiment of the present invention connects the compensation capacitor to the matching resistor in parallel to compensate for bandwidth loss resulting from reducing the resistance of the matching resistor. Consequently, the present invention provides a high-speed optical modulator module with an improved matching impedance having the traits of reduced production cost and ensured reliability of frequency characteristics at high speed, e.g., at around 2.5 GHz.

While there has been illustrated and described what is considered to be the preferred embodiment of the present invention, it will be understood by those skilled in the art that various change and modification may be made, and equivalents may be substituted for elements thereof, without departing from the true scope of the present invention.

What is claimed is:

1. A high-speed optical modulator module comprising:
   a lead frame having an outer lead frame and an inner lead frame, the outer lead frame for receiving a high-speed signal;
   a substrate, in which a metal base having a matching impedance device including a matching resistor and a compensation capacitor, and a submount having a laser diode thereon, are formed, wherein the matching resistor and the compensation capacitor are the same in area;
   a first multi-bonding wire for electrically connecting the inner lead frame of the lead frame to one end of the matching impedance device;
   a second multi-bonding wire for electrically connecting the other end of the matching impedance device to one end of the metal base; and
   a dual-bonding wire for electrically connecting the other end of the metal base to the laser diode.

2. A high-speed optical modulator module as claimed in claim 1, wherein the area is around 560 μm×560 μm.

3. A high-speed optical modulator module as claimed in claim 1, wherein the matching resistor is around 25Ω.

4. A high-speed optical modulator module as claimed in claim 1, wherein the compensation capacitor is around 2.5 pF.

5. A high-speed optical modulator module as claimed in claim 1, wherein the metal base is gold-plated.

6. A high-speed optical modulator module as claimed in claim 1, wherein the matching resistor and the compensation capacitor are connected in parallel.

7. A high-speed optical modulator module as claimed in claim 1, wherein said components, other than the outer lead frame, are packaged with ceramic.

8. A high-speed optical modulator module comprising:
   a lead frame having an outer lead frame and an inner lead frame, the outer lead frame for receiving a high-speed signal;
   a substrate, in which a metal base having a matching impedance device including a matching resistor and a compensation capacitor, and a submount having a laser diode thereon, are formed, wherein the matching resistor and the compensation capacitor are the same in area;
   means for electrically connecting the inner lead frame of the lead frame to one end of the matching impedance device;
   means for electrically connecting the other end of the matching impedance device to one end of the metal base; and
   means for electrically connecting the other end of the metal base to the laser diode.

9. A high-speed optical modulator module as claimed in claim 8, wherein the matching resistor and the compensation capacitor are connected in parallel.

10. A high-speed optical modulator module as claimed in claim 8, wherein the area is around 560 μm×560 μm.

11. A high-speed optical modulator module as claimed in claim 8, wherein the matching resistor is around 25Ω.

12. A high-speed optical modulator module as claimed in claim 8, wherein the compensation capacitor is around 2.5 pF.

13. A high-speed optical modulator module as claimed in claim 8, wherein the metal base is gold-plated.

14. A high-speed optical modulator module comprising:
   a lead frame having an outer lead frame and an inner lead frame, the outer lead frame for receiving a high-speed signal;

a substrate, in which a gold-plated metal base having a matching impedance device including a matching resistor and a compensation capacitor, and a submount having a laser diode thereon, are formed;

means for electrically connecting the inner lead frame of the lead frame to one end of the matching impedance device;

means for electrically connecting the other end of the matching impedance device to one end of the metal base; and means for electrically connecting the other end of the metal base to the laser diode.

15. A high-speed optical modulator module as claimed in claim 14, wherein the matching resistor and the compensation capacitor are the same in area.

16. A high-speed optical modulator module as claimed in claim 15, wherein the area is around 560 $\mu$m×560 $\mu$m.

17. A high-speed optical modulator module as claimed in claim 14, wherein the matching resistor is around 25Ω.

18. A high-speed optical modulator module as claimed in claim 14, wherein the compensation capacitor is around 2.5 pF.

19. A high-speed optical modulator module as claimed in claim 14, wherein said means for electrically connecting the inner lead frame of the lead frame to one end of the matching impedance device and said means for electrically connecting the other end of the matching impedance device to one end of the metal base are multi-bonding wires.

20. A high-speed optical modulator module as claimed in claim 14, wherein said means for electrically connecting the other end of the metal base to the laser diode is a dual-bonding wire.

* * * * *